US011588092B2

(12) United States Patent
Yamane (10) Patent No.: US 11,588,092 B2
(45) Date of Patent: Feb. 21, 2023

(54) PARTICLE DETECTOR, PARTICLE DETECTION APPARATUS, AND PARTICLE DETECTION METHOD (71) Applicant: Kioxia Corporation, Tokyo (JP)

(72) Inventor: Takeshi Yamane, Tsukuba Ibaraki (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/463,282

(22) Filed: Aug. 31, 2021

(65) Prior Publication Data

US 2022/0069191 A1 Mar. 3, 2022

(30) Foreign Application Priority Data

Sep. 1, 2020 (JP) .............................. JP2020-147065

(51) Int. Cl.
H01L 39/10 (2006.01)
G01T 1/29 (2006.01)
H01L 27/18 (2006.01)

(52) U.S. Cl.
CPC ............ *H01L 39/10* (2013.01); *G01T 1/2914* (2013.01); *H01L 27/18* (2013.01)

(58) Field of Classification Search
CPC ........ H01L 39/10; H01L 27/18; G01T 1/2914
See application file for complete search history.

(56) References Cited

U.S. PATENT DOCUMENTS

| 5,880,468 A * | 3/1999 | Irwin ................. G01B 11/0616 374/176 |
| 2016/0260596 A1* | 9/2016 | McDermott, III .. H01J 49/0031 |
| 2018/0248103 A1* | 8/2018 | Ivry ........................ H01L 39/12 |
| 2020/0033488 A1 | 1/2020 | Yamane | |

FOREIGN PATENT DOCUMENTS

| JP | S61-271487 A | 12/1986 |
| JP | S63-260083 A | 10/1988 |
| JP | H7-283447 A | 10/1995 |
| JP | 5846574 B2 | 12/2015 |
| JP | 2020-16543 A | 1/2020 |

* cited by examiner

*Primary Examiner* — Hugh Maupin
(74) *Attorney, Agent, or Firm* — Finnegan, Henderson, Farabow, Garrett & Dunner, LLP (57) ABSTRACT A particle detector according to one embodiment includes: superconductive lines, conductive lines, insulating films, a first detection circuit, and a second detection circuit. The superconductive lines extend in a first direction and are arranged in a second direction intersecting the first direction. The conductive lines extend in a third direction different from the first direction and are arranged in a fourth direction intersecting the third direction. The insulating films are each interposed at an intersection point between one of the superconductive lines and one of the conductive lines. The first detection circuit detects a voltage change occurring in the superconductive lines. The second detection circuit detects a current or a voltage generated in the conductive lines when the voltage change occurs.

12 Claims, 8 Drawing Sheets

PARTICLE DETECTOR, PARTICLE DETECTION APPARATUS, AND PARTICLE DETECTION METHOD

CROSS-REFERENCE TO RELATED APPLICATION

This application is based upon and claims the benefit of priority from Japanese Patent Application No. 2020-147065, filed on Sep. 1, 2020; the entire contents of which are incorporated herein by reference.

FIELD

Embodiments described herein relate to a particle detector, a particle detection apparatus, and a particle detection method.

BACKGROUND

A three-dimensional atom probe has long been known as an apparatus that makes it possible to analyze, for example, a crystal grain boundary of alloys or a surface boundary of a semiconductor multi-layer film at an atomic level with high special resolution and high detection sensitivity.

DETAILED DESCRIPTION

According to one embodiment, a particle detector is provided. The particle detector includes: a plurality of superconductive lines each including a superconductive material, a plurality of conductive lines each including a conductive material, insulating films, a first detection circuit, and a second detection circuit. The superconductive lines extend in a first direction and are arranged in a second direction intersecting the first direction. The conductive lines extend in a third direction different from the first direction and are arranged in a fourth direction intersecting the third direction. The insulating films are each interposed at an intersection point between one of the plurality of superconductive lines and one of the plurality of conductive lines. The first detection circuit is configured to detect a voltage change occurring in the plurality of superconductive lines. The second detection circuit is configured to detect a current or a voltage generated in the plurality of conductive lines when the voltage change occurs.

Non-limiting, exemplary embodiments of the present invention will now be described with reference to the accompanying drawings. In the drawings, the same or corresponding reference marks are given to the same or corresponding members or components, and redundant explanations will be omitted. It is to be noted that the drawings are illustrative of the invention, and there is no intention to indicate scale or relative proportions among the members or components, or between thicknesses of various layers. Therefore, the specific thickness or size should be determined by a person having ordinary skill in the art in view of the following non-limiting embodiments.

Figure 1:
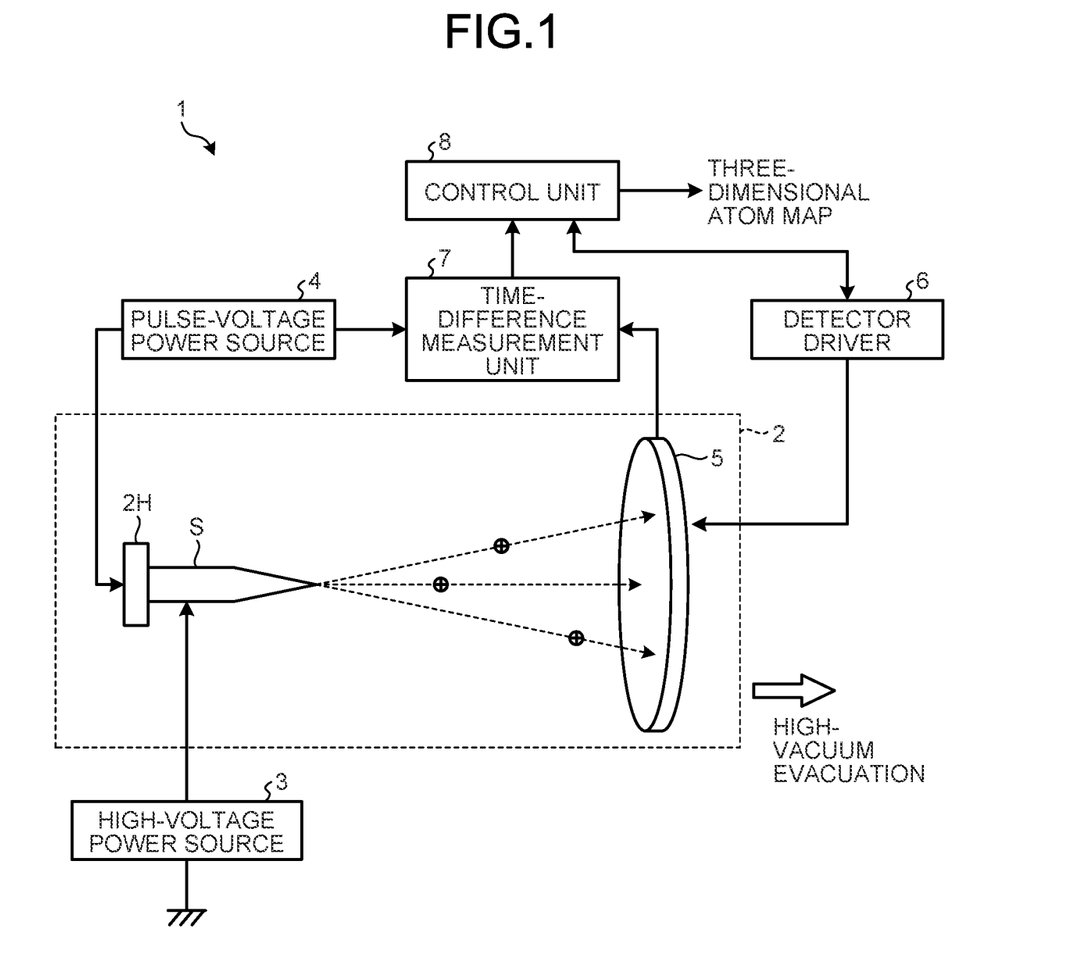
FIG. 1 is a diagram schematically illustrating a three-dimensional atom probe apparatus that a particle detector according to one embodiment may be employed.

FIG. 1 is a diagram schematically illustrating a three-dimensional atom probe apparatus that a particle detector according to one embodiment may be applied. As illustrated in FIG. 1, a three-dimensional atom probe apparatus 1 includes a housing 2, a high-voltage power source 3, a pulse-voltage power source 4, a particle detector 5, a detector driver 6, a time-difference measurement unit 7, and a control unit 8.

The housing 2 is a container that is air-tight to the outside. The housing 2 is connected to a high vacuum evacuation apparatus (not illustrated) such as a diffusion pump, a turbo molecular pump (TMP), and the like. With this configuration, the inside of the housing 2 can be maintained at a reduced pressure or a high vacuum. In addition, a sample holding member 2H capable of holding a sample S to be measured is provided inside the housing 2. Furthermore, the housing 2 may be provided with a load lock chamber, a gate valve, a transfer arm, and the like (not illustrated), for transferring in/out the sample S.

The high-voltage power source 3 is capable of applying a high voltage to the sample S held by the sample holding member 2H in the housing 2. The pulse-voltage power source 4 is capable of applying a pulse voltage to the sample S to which the high voltage is applied by the high-voltage power source 3 in a superimposed manner. The particle detector 5 is disposed in the housing 2 such that a particle detection surface faces the sample holding member 2H (or the sample S). The particle detector 5 is controlled by the detector driver 6. The particle detector 5 receives ions, which are released (by evaporation) from the sample S, and generates signals corresponding to the received ions to output the signals. The time-difference measurement unit 7 receives the signals from the particle detector 5. After that, the time-difference measurement unit 7 calculates a time-difference (that is, a flight time of particles such as the ions) between a time when the driving pulse-voltage is applied to the sample S by the pulse-voltage power source 4 and a time when each of the particles arrives at the particle detector 5.

The control unit 8 identifies each ion (or particle) based on the flight time calculated by the time-difference measurement unit 7, and performs a predetermined calculation process on the signal input by the detector driver 6. Additionally, the control unit 8 is capable of comprehensively controlling the three-dimensional atom probe apparatus 1 including the pulse-voltage power source 4, the particle detector 5, and the like. Input/output devices and a display unit (not illustrated) may be connected to the control unit 8.

Note that the control unit 8 may be implemented by hardware including an application specific integrated circuit (ASIC), a programmable gate array (PGA), a field programmable gate array (FPGA). Alternatively, the control unit 8 may be implemented as a computer including, for example, a central processing unit (CPU) as a hardware processor, a read only memory (ROM), and a random access memory (RAM). The control unit 8 controls the three-dimensional atom probe apparatus 1 as a whole in accordance with a predetermined computer program and various data, and performs various kinds of calculation processes. The computer program and various data may be downloaded from, for example, a non-transitory computer-readable storage medium such as a hard disk drive (HDD), a semiconductor memory, a server, and the like by wire or wirelessly. Moreover, the detector driver 6, the time-difference measurement unit 7, and the control unit 8 may be configured as one unit. Such a combination may contribute to improvement of the convenience and spacing-saving.

In the three-dimensional atom probe apparatus 1 including the above-described configuration, the sample S, whose distal end is processed in advance into a needle shape, is hold by the sample holding member 2H within the housing 2, and the housing 2 is exhausted to a high vacuum. A degree of vacuum at this time may be low enough for field evaporation to be caused in the sample S. In addition, a high voltage is applied to the sample S in the housing 2 by the high-voltage power source 3. This voltage allows a high electric field to be caused between the sample S and the particle detector 5, and the electric field locally concentrates to, in particular, the needle-shaped distal end of the sample S. The voltage applied to the sample S may be slightly lower than a voltage that allows an ion to be released from the needle-shaped distal end of the sample S, and may be in a range, for example, 500V to 1000V depending on types of samples subjected to measurement. Subsequently, by applying a driving pulse-voltage on the sample S from the pulse-voltage power source 4, the atom(s) ionizes at the distal end of the sample S and releases therefrom (field evaporation). At this time, a pulse laser may be used instead of the driving pulse-voltage, or a configuration using the pulse laser in addition to the driving pulse-voltage may be employed. The released ion(s) flies following the electric field caused between the sample S and the particle detector 5, and is incident upon the particle detection surface of the particle detector 5. When the ion(s) is incident thereon, the particle detector 5 produces a signal and outputs this signal to the time-difference measurement unit 7. The time-difference measurement unit 7 calculates a flight time and outputs a signal indicating the flight time to the control unit 8. The control unit 8 identifies ion species based on the flight time, and determines a two-dimensional arrangement of an element(s). Then, the driving pulse-voltage is repeatedly applied from the pulse-voltage power source 4 to the sample S, an ion(s) is sequentially detected along a depth direction of the sample S, and data indicating the ion species and arrangements are re-constructed. As a result, a three-dimensional atom distribution map is produced.

Figure 2:
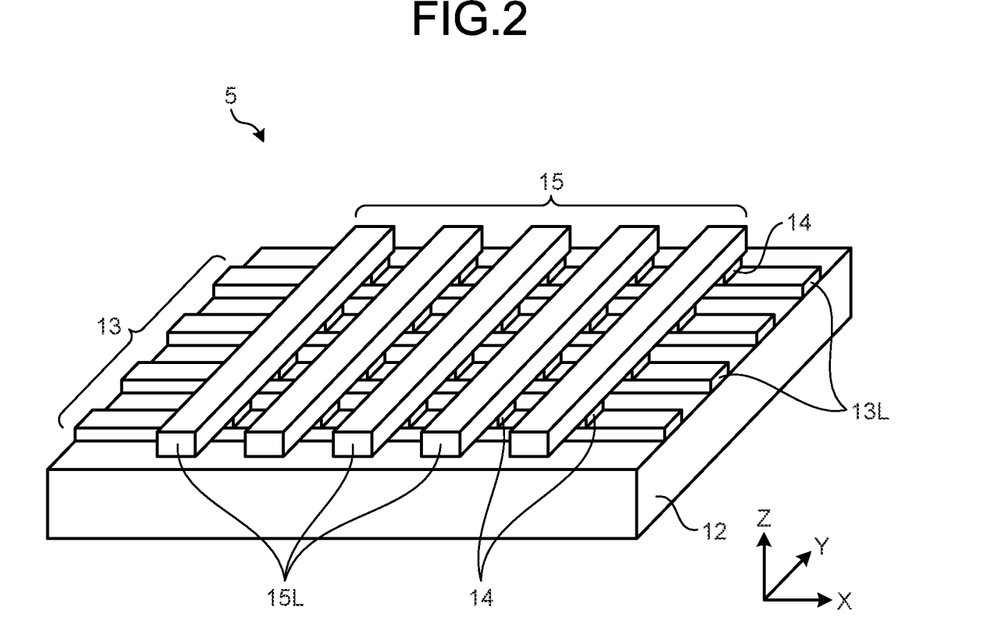
FIG. 2 is a partial perspective view schematically illustrating the particle detector according to the embodiment.

Next, with referring to FIG. 2 through FIG. 6, an explanation will be made on the particle detector 5 according to the present embodiment. FIG. 2 is a partial perspective view schematically illustrating the particle detector 5 according to present embodiment. As illustrated in FIG. 2, the particle detector 5 is provided with a substrate 12, a group of normal conductive lines 13, a tunnel insulating film 14, and a group of superconductive lines 15. The substrate 12 may be, for example, a semiconductor substrate such as a silicon wafer.

The group of normal conductive lines 13 includes a plurality of normal conductive lines 13L. The normal conductive lines 13L extend in an X-axis direction (an example of the third direction) in the drawing. The normal conductive lines 13L are arranged substantially in parallel with one another in a Y-axis direction (an example of the fourth direction) at substantially even intervals. The normal conductive lines 13L may be formed of a normal conductive material. The material for the normal conductive material may be, for example, a metal such as silver or the like. The group of superconductive lines 15 includes a plurality of superconductive lines 15L. The superconductive lines 15L extend in a direction (Y-axis direction (an example of the first direction)) intersecting a longitudinal direction (X-axis direction (an example of the second direction)) of the normal conductive lines 13L. The superconductive lines 15L are arranged substantially in parallel with one another substantially in the longitudinal direction of the normal conductive lines 13L at substantially even intervals. The superconductive lines 15L may be formed of a superconductive material such as niobium and the like. The superconductive lines 15L and the normal conductive lines 13L are arranged in a manner orthogonal to each other and are stacked in a vertical direction (Z-axis direction) to form a lattice shape in top view. The tunnel insulating films 14 are each interposed at an intersection point (junction) between one of the superconductive lines 15L and one of the normal conductive lines 13L. The tunnel insulating films 14 may be formed of, for example, an insulating material such as aluminum oxide or the like. Additionally, the tunnel insulating films 14 are thin films each have the thickness enough to flow therein a tunneling current between the superconductive line 15L and the normal conductive line 13L. Such a thickness may be, for example, approximately several nanometers. Note that, in the illustrated example, the superconductive lines 15L constitute the particle detection surface of the particle detector 5.

Figure 3A:
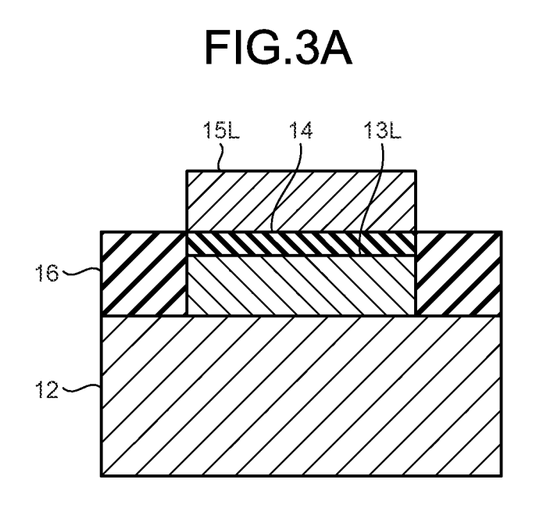
FIG. 3A is a cross-sectional view taken along a diagonal line at a junction of a superconductive line and a normal conductive line of the particle detector according to the embodiment.
Figure 3B:
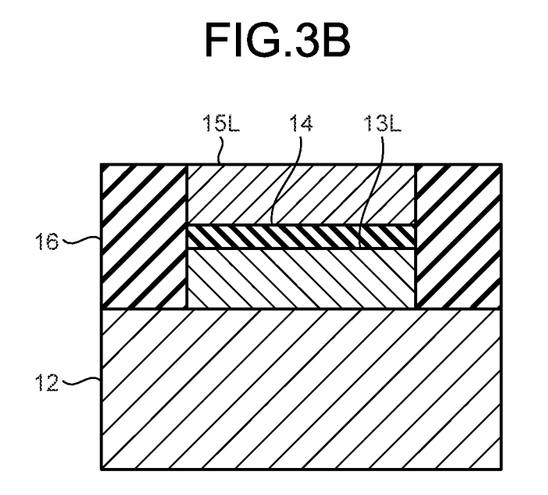
FIG. 3B is a cross-sectional view taken along a diagonal line at a junction of the superconductive line and the normal conductive line in a modified example.

FIG. 3A is a cross-sectional view taken along a diagonal line at the junction of the superconductive line 15L and the normal conductive line 13L. FIG. 3B is a cross-sectional view taken along a diagonal line at a junction of the superconductive line 15L and the normal conductive line 13L in a modified example. As illustrated in FIGS. 3A and 3B, a stacked body in which the normal conductive lines 13L, the tunnel insulating film 14, and the superconductive lines 15L are stacked in this order is formed on the substrate 12. Additionally, an insulating material 16 is provided around such a stacked body. In other words, the insulating material 16 is filled into an area between the junctions of the superconductive lines 15L and the normal conductive lines 13L in the particle detector 5 according to present embodiment. An upper surface of the insulating material 16 may be co-planner with an upper surface of the tunnel insulating film 14 as illustrated in FIG. 3A, or co-planner with an upper surface of the superconductive line 15L as illustrated in FIG. 3B. The insulating material 16 may be formed of, for example, a material same as the tunnel insulating film 14. Note that the area around the stacked body may be hollow without providing the insulating material 16.

Figure 4:
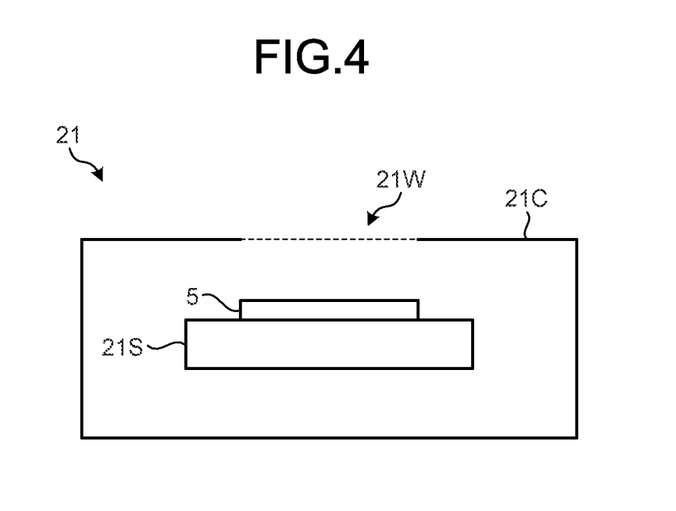
FIG. 4 is a view schematically illustrating a cooling apparatus that may be employed in the three-dimensional atom probe apparatus of FIG. 1.

The particle detector 5 may be housed within a cooling apparatus in the housing 2 of the three-dimensional atom probe apparatus 1 in order to cool the superconductive material constituting the superconductive lines 15L at a critical temperature (transition temperature) or lower. FIG. 4 is a view schematically illustrating the cooling apparatus. As illustrated, a cooling apparatus 21 includes a thermal insulation container 21C, and a cooling stage 21S formed of a thermally conductive material having relatively a large thermal conductivity. The conductive material for the cooling stage 21S may be a metal such as copper, aluminum, or the like. The thermal insulation container 21C includes a window part 21W that is covered with a mesh member formed of a conductive material. The mesh member allows the ion(s) to pass therethrough and insulates a radiation heat. The particle detector 5 is arranged on the cooling stage 21S such that the particle detection surface faces the window part 21W. The cooling stage 21S is connected to an unillustrated refrigerator to cool the cooling stage 21S as a whole by thermal conduction. With this configuration, the particle detector 5 is maintained at a temperature equal to or lower than a critical temperature that depends on types of superconductive materials.

Figure 5:
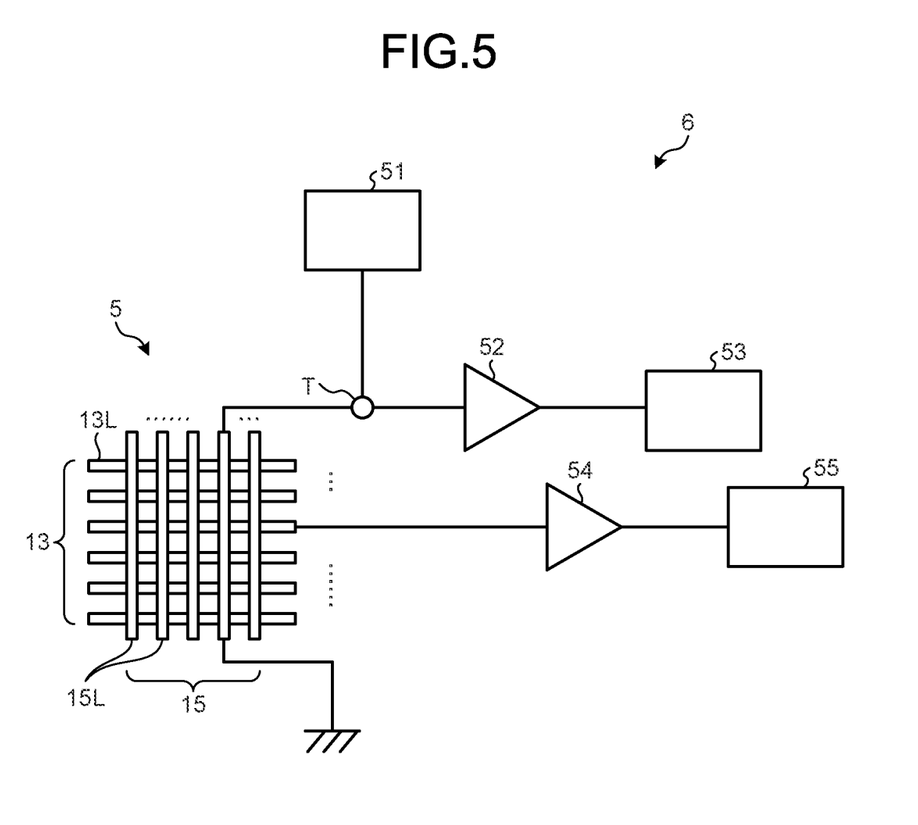
FIG. 5 is a view schematically illustrating the particle detector according to the embodiment and a detector driver connected thereto.

Next, with referring now to FIG. 5, the detector driver 6 will be explained. FIG. 5 is a view schematically illustrating the particle detector 5 and the detector driver 6 connected thereto. The detector driver 6 is provided with a power source 51, an amplifier 52, a voltage-change detecting element 53 (an example of the first detection circuit), an amplifier 54, and an electric current detecting element 55 (an example of the second detection circuit). The power source 51 supplies an electric current (bias electric current) to each of the superconductive lines 15L of the group of superconductive lines 15. The amplifier 52 amplifies a voltage-change in each of the superconductive lines 15L. The voltage-change detecting element 53 detects a voltage-change based on an output from the amplifier 52. The amplifier 54 amplifies electric current from each of the normal conductive lines 13L of the group of normal conductive lines 13. One pair of the amplifier 52 and the voltage-change detecting element 53 may be provided for each of the superconductive lines 15L, and similarly, one pair of the amplifier 54 and the electric current detecting element 55 may be provided for each of the normal conductive lines 13L. Additionally, a bias tee T is provided at a branch point where an electric line is branched to the power source 51 from another electric line connecting the amplifier 52 and the superconductive lines 15L. By providing the bias tee T, a DC voltage generated by the power source 51 can be applied to the superconductive lines 15L without affecting a high-frequency component of a signal generated from the superconductive lines 15L. Therefore, a voltage-change can be detected with relatively high accuracy by the voltage-change detecting element 53.

Figure 6:
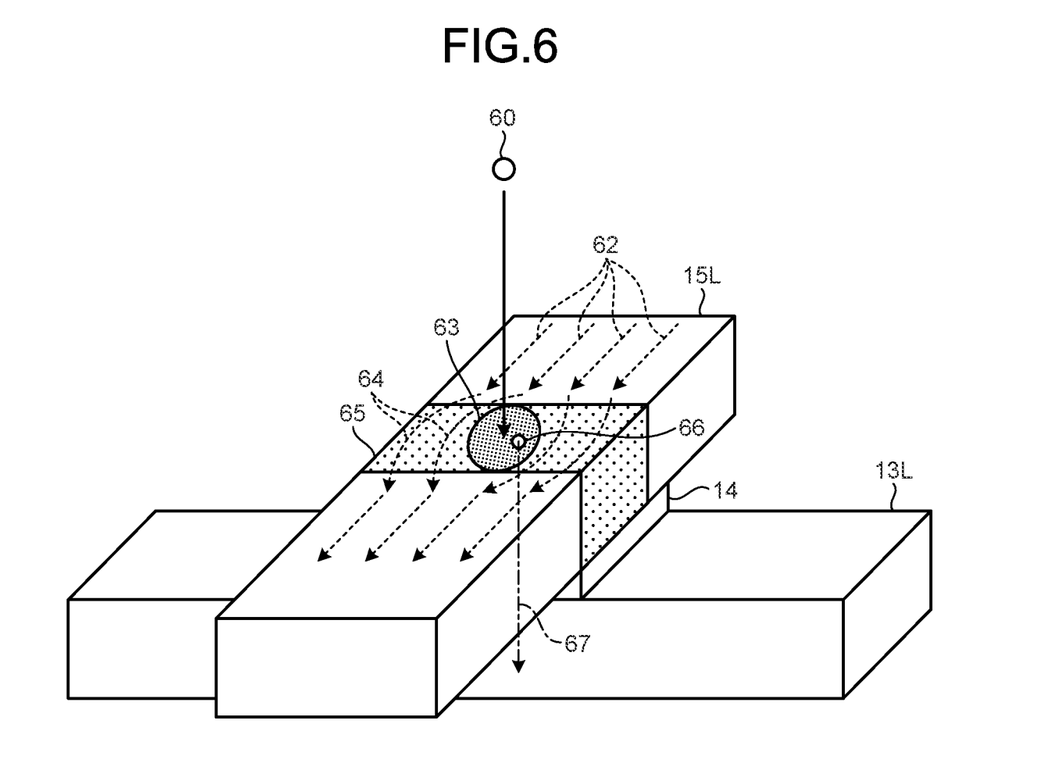
FIG. 6 is an explanatory view for explaining a detection principle of particles.

Next, with referring to FIG. 6, an explanation will be made on a detection principle of particles such as ions and the like according to the particle detector 5. FIG. 6 is an explanatory view for explaining the detection principle of the particles. As indicated by arrows 62 with broken lines in the drawing, an electric current, which is not beyond a superconducting critical current, preliminarily flows in each of the superconductive lines 15L by the power source 51 (FIG. 5). Here, when a particle 60 such as an ion impacts (or is absorbed into) one of the superconductive lines 15L of the group of superconductive lines 15, a superconducting-to-normal transition occurs in an area 63 including the impact point (or a point of particle incidence). Then, the area 63 comes to have electrical resistance, and the electric current flows to detour around the area 63 as indicated by arrows 64 with broken lines in FIG. 6. Such a detour causes the electric current to densely flow at both sides of the area 63, and to exceed the superconducting critical current. Thus, the superconducting-to-normal transition may occur even in an area 65 that is wider than the area 63. In this case, part of the superconductive line 15L, which is in the superconductive state, is divided by a normal conductive part (the area 65). As a result, electrical resistance increases and such an increased electrical resistance increases a voltage in the superconductive line 15L. After that, when the area 65 is cooled and returned to the superconductive state, the voltage is lowered to approximately zero. Thus, a pulse-like voltage-change (or a pulse voltage) is generated in the superconductive line 15L, on which the particle 60 impacts (or into which the particle 60 is absorbed). The pulse voltage is detected by the voltage-change detecting element 53 (FIG. 5). The detected pulse voltage is given to the time-difference measurement unit 7. The time-difference measurement unit 7 determines, based on the pulse voltage, a point in time when the particle 60 impacts the superconductive line 15L. The pulse voltage is transmitted to the time-difference measurement unit 7 substantially at a velocity of light. Therefore, the point in time when the particle 60 impacts the superconductive line 15L can be obtained with high accuracy when the pulse voltage reaches the time-difference measurement unit 7.

Moreover, when the particle 60 impacts the superconductive lines 15L, a Cooper pair existing in the superconductive line 15L is broken apart and an electron 66 is generated by the kinetic energy that the particle 60 possess. The electron 66 tunnels through the tunnel insulating film 14, as indicated by a dashed line arrow 67 in FIG. 6, and reaches the normal conductive lines 13L. Then, the electron 66 is detected as an electric current by the electric current detecting element 55 (FIG. 5) connected to the normal conductive lines 13L. The number of the electrons 66 to be generated depends on the kinetic energy of the particle, so that the kinetic energy of the particle can be obtained based on an amount of charge that is obtained by accumulating electric currents detected by the current detecting element 55. In this case, the pulse voltage generated in the superconductive line 15L may be used as a trigger for measuring a tunneling current flowing through the normal conductive lines 13L. Based on the superconductive line 15L from which the pulse voltage is detected and the normal conductive line 13L from which the tunneling electric current is detected, an X-Y coordinate indicating a position where the particle 60 impacts the particle detector 5 (or indicating a position of particle incidence) can be determined. Specifically, the control unit 8 recognizes which one of the voltage-change detecting elements 53 (FIG. 5) connected to the corresponding superconductive lines 15L outputs the pulse voltage, and recognizes which one of the electric current detecting elements 55 connected to the corresponding normal conduction lines 13L detects a tunneling electric current. Then, the X-Y coordinate point is determined.

As described above, according to the particle detector 5 of the present embodiment, when a particle impacts (or is absorbed into) the superconductive line 15L, the pulse voltage generated by a transition from the superconductive state to the normal conductive state in the superconductive line 15L is detected. Therefore, a point in time when the particle impacts thereon can be detected with accuracy. Accordingly, a time of flight spent by the particle from the sample S to the particle detector 5 can also be detected with accuracy, so that it is possible to identify the particle with accuracy.

Additionally, the group of normal conductive lines 13 are provided to intersect with the group of superconductive lines 15 through the tunnel insulating film 14, so that the electron generated through break-apart of the Cooper pair in the superconductive line 15L can be detected as a tunneling current. Therefore, the position of particle impact (or the position of particle incidence) can be determined based on the superconductive line 15L from which the pulse voltage is detected and the normal conductive line 13L from which the tunneling current is detected. With this configuration, two-dimensional information about the particles released from the sample S can be acquired.

Moreover, the kinetic energy of the particle can be obtained from the tunneling current detected in the normal conductive line 13L, so that constitutions of the particle may be identified. In other words, although different particles cannot be distinguished by kinetic energy alone when those particles have the same flight time and different kinetic energy, such particles can be distinguished by the present embodiment because it is capable of obtaining the kinetic energy.

Modified Example 1

Figure 7:
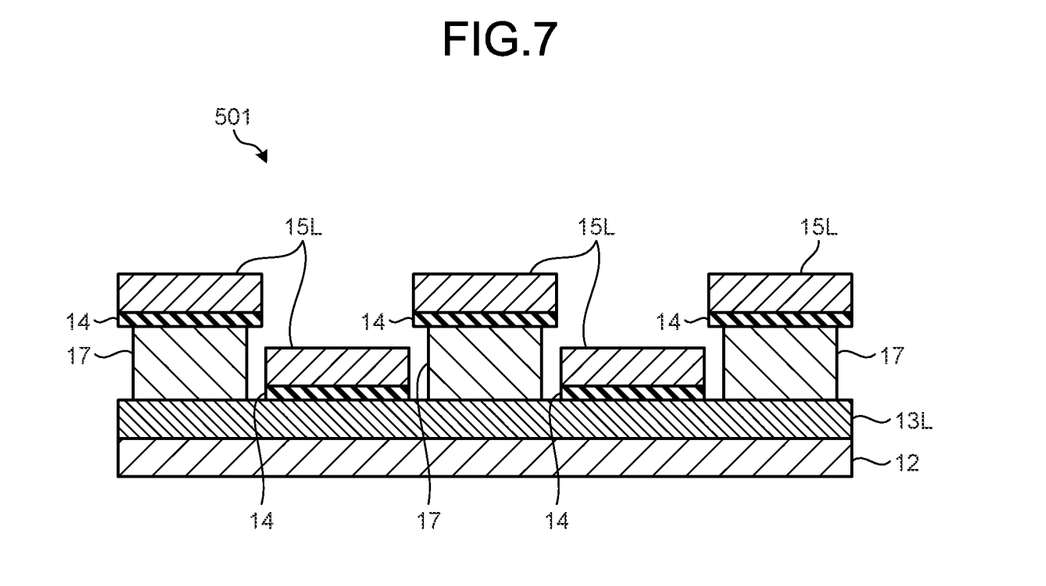
FIG. 7 is a cross-sectional view taken along an extending direction of a normal conduction line in a particle detector according to Modified Example 1.

Next, with referring to FIG. 7, an explanation will be made on Modified Example 1 of the particle detector 5 according to present embodiment. FIG. 7 is a cross-sectional view taken along an extending direction of the normal conductive line in the particle detector according to Modified Example 1. As illustrated in FIG. 7, a particle detector 501 according to Modified Example 1 includes the substrate 12, the normal conductive lines (only one normal conductive line 13L is illustrated in FIG. 7), the tunnel insulating film 14, and the group of superconductive lines 15. In addition, the particle detector 501 includes contacts 17. The contacts 17 are provided between the tunnel insulating film 14 and the corresponding normal conduction line 13L beneath every other one of the superconductive lines 15L. Thus, the superconductive lines 15L are alternately different in height in the particle detector 501, as shown in FIG. 7. With this structure, gaps between the superconductive lines 15L may substantially disappear in top view, enabling particles to impact the superconductive lines 15L with high probability. Note that the contacts 17 may be formed of the same material as the normal conductive lines 13L.

Modified Example 2

Figure 8:
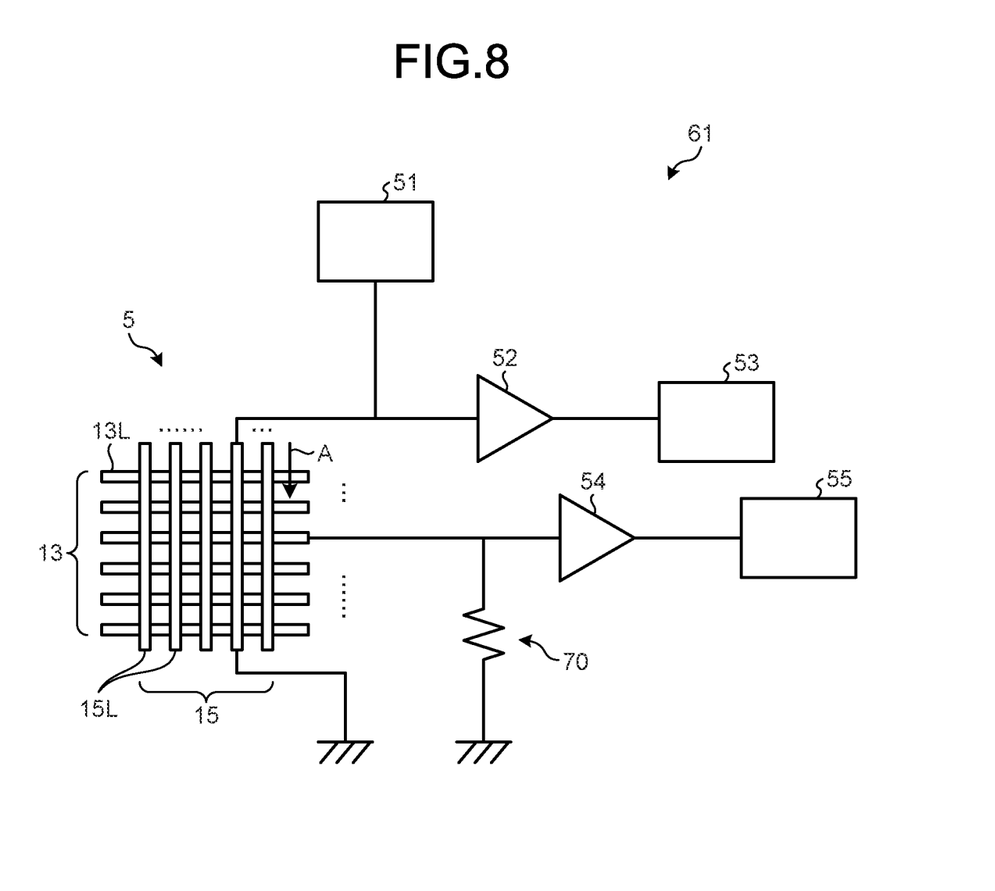
FIG. 8 is a view schematically illustrating a detector driver that may be employed in Modified Example 2.

With referring to FIG. 8, an explanation will be made on Modified Example 2 of the above-described embodiment. In Modified Example 2, a particle detector is the same as the foregoing particle detector 5, whereas a detector driver 61 that drives the particle detector 5 is different from the foregoing the detector driver 6 (FIG. 5). FIG. 8 is a view schematically illustrating a detector driver 61 used in Modified Example 2. In addition to the configuration of the detector driver 6, the detector driver 61 includes a resistor 70 between a ground and an electric line that connects the corresponding normal conductive line 13L and an input terminal of the corresponding amplifier 54.

The particle detector 5 has a configuration that the tunnel insulating film 14 is interposed between two conductors: the superconductive line 15L and the normal conductive line 13L. Thus, this configuration can be considered as a capacitor. Thus, the pulse voltage generated due to impact (and absorption) of the particle on the superconductive line 15L is transmitted to the normal conductive lines 13L through the capacitor. More specifically, a positive (or an upward convex shape) pulse voltage is transmitted to the normal conductive lines 13L located upstream along a flow direction A (FIG. 8) of a current supplied to the superconductive line 15L from the power source 51 with respect to an impact point of a particle (a position of particle impact). On the other hand, a negative (or a downward convex shape) pulse voltage is transmitted to the normal conductive lines 13L located downstream along the direction A with respect to the impact point of the particle.

Figure 9A:
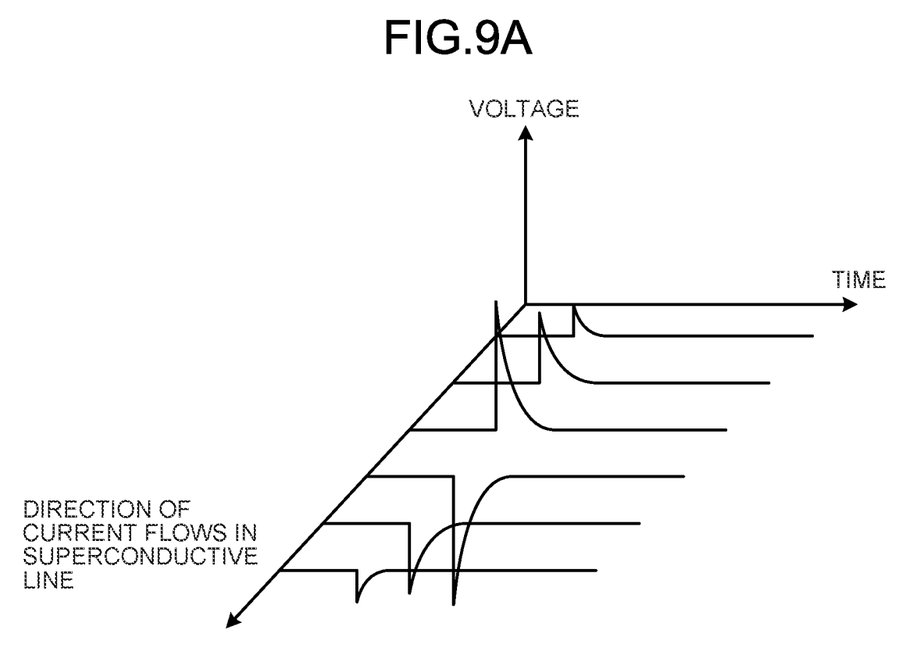
FIG. 9A is a graph illustrating a pulse-voltage change with the elapse of time in a normal conductive line.

With referring to FIG. 9A and FIG. 9B, an explanation will be made on a pulse voltage that transmits to the normal conductive lines 13L. FIG. 9A is a graph illustrating a pulse-voltage change with time in the normal conductive lines 13L. A horizontal axis indicates time, and a vertical axis indicates a voltage value. An additional axis orthogonal to the horizontal and vertical axes indicates positions of the normal conductive lines 13L. The additional axis corresponds to the direction A of the current flowing in the superconductive line 15L in FIG. 8.

Figure 9B:
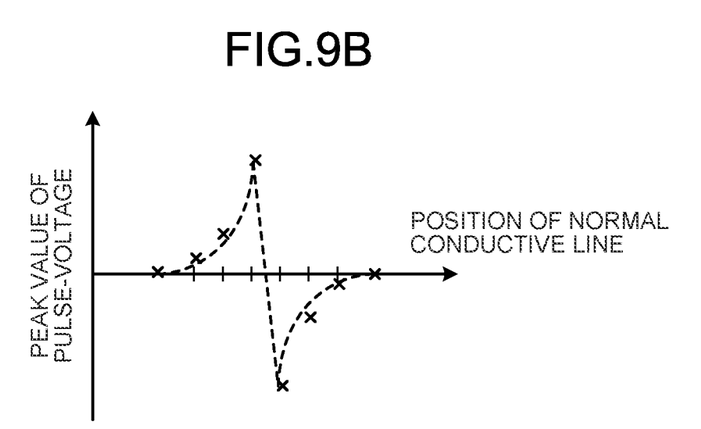
FIG. 9B is a graph obtained by plotting a pulse-voltage value in a normal conductive line with respect to a position thereof.

Referring to a graph of FIG. 9A, it is found that the positive pulse-voltage gradually increases along the additional axis corresponding to the direction A of the current flow in the superconductive line 15L. However, the positive pulse-voltage abruptly changes to the negative pulse-voltage, and, after that, the negative pulse-voltage becomes smaller with the elapse of time. FIG. 9B is a graph obtained by plotting the pulse-voltage values in the normal conductive lines 13L with respect to positions of the normal conductive lines 13L (horizontal axis). As illustrated in the graph of FIG. 9B, a Y-coordinate where the particle impacts can be identified based on a position where the pulse-voltage value changes from plus to minus. More specifically, the control unit 8 detects, for each of the normal conductive lines 13L, a peak voltage indicating a maximum value among absolute values of voltages measured with respect to a corresponding normal conductive line 13L. The control unit 8 specifies one of the normal conductive lines 13L from which a positive peak voltage is detected and another one of the normal conductive lines 13L from which a negative peak voltage is detected. Then, based on the specified two normal conductive lines, the control unit 8 calculates (or identifies) a Y-coordinate of the position where the particle impacts (position of particle incidence). Note that the two normal conductive lines 13L to be specified may be the ones adjacent to each other. Accordingly, Modified Example 2 is different from the foregoing embodiment (including Modified Example 1) where the Y coordinate is identified by measuring the tunneling electric current originated from breakage-apart of the Cooper pair, in that the Y coordinate can be identified based on the pulse voltage generated by particle impact on (and absorption into) the superconductive lines 15L.

In Modified Example 2, due to the resistor 70 between the normal conductive line 13L and the ground, an electric potential in the normal conductive line 13L becomes substantially same as an electric potential in the superconductive lines 15L. Therefore, while eliminating an influence of the tunneling current that may be generated by a potential difference between the superconductive lines 15L and the normal conductive lines 13L, the tunneling current originated from breakage-apart of the Cooper pair can be measured with accuracy.

Moreover, in Modified Example 2, the X-coordinate of the position of particle impact in the particle detector 5 can be obtained by detecting the pulse voltage generated in the superconductive lines 15L in the same manner as the foregoing embodiment where the detector driver 6 is used. Additionally, the positive and negative pulse-voltages can be identified by the current detecting element 55 through a current change based on the pulse-voltage change. Moreover, a change from the positive to the negative pulse-voltage can be identified by the control unit 8 that receives information indicating the pulse voltage from the detector driver 6.

Modified Example 3

Figure 10:
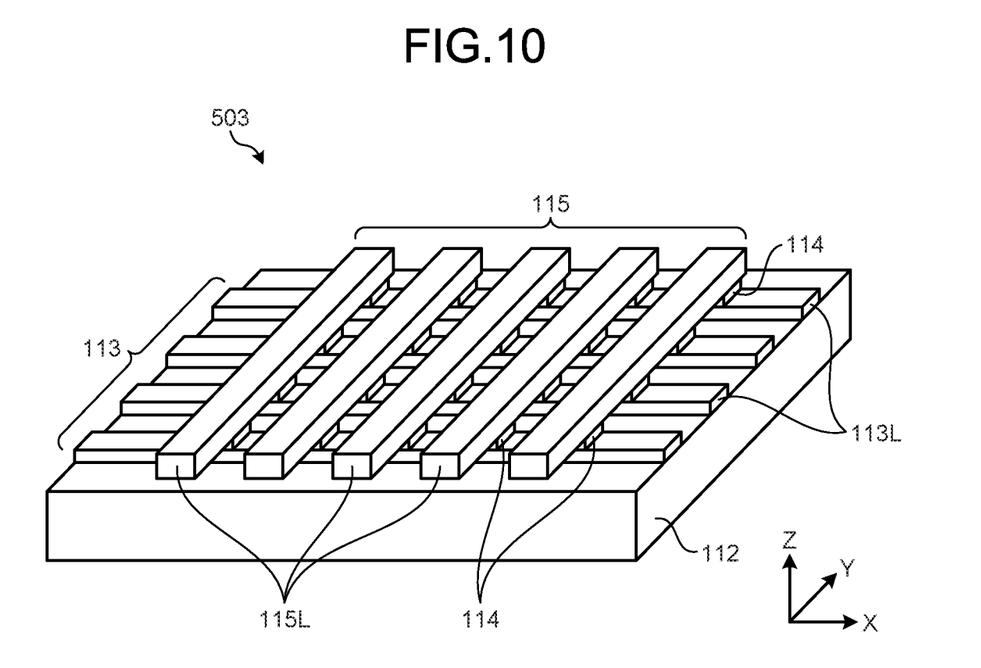
FIG. 10 is a partial perspective view schematically illustrating a particle detector according to Modified Example 3.

Next, with referring to FIG. 10, an explanation will be made on Modified Example 3 of the particle detector 5 according to the embodiment. As illustrated in FIG. 10, in a particle detector 503 according to Modified Example 3, a group of first superconductive lines 113, tunnel insulating films 114, and a group of second superconductive lines 115 are formed in this order on the substrate 112. The particle detector 503 is not provided with the group of normal conductive lines 13 in the foregoing particle detector 5 (or 501), but is instead provided with the group of first superconductive lines 113. In short, both of the groups consist of superconductive lines. The group of first superconductive lines 113 and the group of second superconductive lines 115 may be formed of the same superconductive material or different superconductive materials. Note that the other configuration of the particle detector 503 is the same as the particle detector 5 (or 501). Additionally, the group of second superconductive lines 115 constitute a particle detection surface of the particle detector 503.

For the particle detector 503, an electric potential may be set higher at the group of second superconductive lines 115 than at the group of first superconductive lines 113 such that the potential difference therebetween is smaller than an energy gap of the group of first superconductive lines 113 or the group of second superconductive lines 115. With this adjustment, a Josephson current may be prevented from flowing into the group of second superconductive lines 115 from the group of first superconductive lines 113. Additionally, a magnetic field may be applied in a parallel direction to a surface of the substrate 112 in order to inhibit the Josephson current due to a first superconductive line 113L and a second superconductive line 115L.

As described above, by the particle detector 503, a point in time when a particle impacts (and is absorbed into) the superconductive lines can be detected with high accuracy. In addition, an X-Y coordinate of a position of the particle impact (and absorption), a kinetic energy, or an energy of the particle can be detected. Note that Modified Example 1 or Modified Example 2 or both can be applied to Modified Example 3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modified examples as would fall within the scope and spirit of the inventions.

For example, while the group of normal conductive lines 13, the tunnel insulating films 14, and the group of superconductive lines 15 are formed in this order on the substrate 12 in the particle detector 5, the order may be opposite. Namely, the group of superconductive lines 15, the tunnel insulating films 14, and the group of normal conductive lines 13 may be formed in this order on the substrate 12 in order to detect a particle, for example, an X-ray photon, which is capable of passing through the group of normal conductive lines 13. In this case, the group of normal conductive lines 13 constitute a particle detection surface. Additionally, while the explanation has been made taking an example where the particles such as ions and the like impact the group of superconductive lines 15 (the second superconductive lines 115) in the embodiment(s), other particles can be detected as far as the particles are absorbed into the group of superconductive lines. Such particles may include a photon. In this case, the number of electrons generated through breakage-apart of the Cooper pairs when the photon is absorbed into the group of superconductive lines depends on an energy of the photon. Therefore, by measuring the number of electrons (or current), the energy of photon can be estimated.

Moreover, also in the particle detector 501 of the above-described Modified Example 1, the group of superconductive lines 15, the tunnel insulating films 14, and the group of normal conductive lines 13 may be also formed in this order on the substrate 12. In this case, the contacts 17 may be provided between the tunnel insulating films 14 and the corresponding conduction lines 13L above every other one of the superconductive lines 15L.

Additionally, when the group of first superconductive lines 113 and the group of second superconductive lines 115 are formed of different superconductive materials in the particle detector 503 according to Modified Example 3, the particle detector 503 may be maintained at the critical temperatures of the both or lower. Moreover, the group of second superconductive lines 115 may be formed of a superconductive material having a critical temperature higher than that of a superconductive material constituting the first superconductive lines 113. In this case, the particle detector 503 may be set at a temperature by the control unit 8 such that the group of second superconductive lines 115 is at the critical temperature thereof or lower, and the group of first superconductive lines 113 becomes higher than the critical temperature thereof. In other words, while the group of second superconductive lines 115 functions as a superconductor, the group of first superconductive lines 113 functions substantially as a normal conductor.

Additionally, while the particle detector 5 and the detector driver 6 are explained as separate elements in the above explanation, a combination of both may serve as a particle detector. Moreover, the number of the superconductive lines 15L and the normal conductive lines 13L is not limited to that in the drawings, but may be arbitrarily determined.

Moreover, the explanation has been made by taking as an example of a case where the particle detector 5 and the like according to the embodiment (or Modified Examples) is applied in the three-dimensional atom probe apparatus. However, without limiting to this case, the particle detectors according to the embodiment can be used in other measurement apparatus.

What is claimed is:
1. A particle detector comprising:
   a plurality of superconductive lines each including a superconductive material, the plurality of superconductive lines extending in a first direction and being arranged in a second direction intersecting the first direction;
   a plurality of conductive lines each including a conductive material, the plurality of conductive lines extending in a third direction different from the first direction and being arranged in a fourth direction intersecting the third direction;

insulating films each being interposed at an intersection point between one of the plurality of superconductive lines and one of the plurality of conductive lines;

a first detection circuit configured to detect a voltage change occurring in the plurality of superconductive lines; and a second detection circuit configured to detect a current or a voltage generated in the plurality of conductive lines when the voltage change occurs.

2. The particle detector according to claim 1, wherein the first direction is orthogonal to the third direction.

3. The particle detector according to claim 1, wherein the second detection circuit is configured to detect, as the current generated in the plurality of conductive lines, a tunneling current generated by that an electron tunnels through one of the insulating films, the electron being generated due to particle incidence into one of the plurality of superconductive lines corresponding to the one of the insulating films.

4. The particle detector according to claim 1, wherein the second detection circuit is configured to detect a pulse voltage as the voltage generated in the plurality of conductive lines.

5. A particle detection apparatus comprising:
a housing;
a sample holding member capable of holding a sample and provided within the housing;
a particle detector provided within the housing such that a particle detection surface of the particle detector faces the sample holding member, the particle detector including
a plurality of superconductive lines each including a superconductive material, the plurality of superconductive lines extending in a first direction and being arranged in a second direction intersecting the first direction,
a plurality of conductive lines each including a conductive material, the plurality of conductive lines extending in a third direction different from the first direction and being arranged in a fourth direction intersecting the third direction, and
insulating films each being interposed at an intersection point between one of the plurality of superconductive lines and one of the plurality of conductive lines,
a first detection circuit configured to detect a voltage change occurring in the plurality of superconductive lines; and
a second detection circuit configured to detect a current or a voltage generated in the plurality of conductive lines when the voltage change occurs.

6. The particle detection apparatus according to claim 5, wherein the first direction is orthogonal to the third direction.

7. The particle detection apparatus according to claim 5, wherein the second detection circuit is configured to detect, as the current generated in the plurality of conductive lines, a tunneling current generated by that an electron tunnels through one of the insulating films, the electron being generated due to particle incidence into one of the plurality of superconductive lines corresponding to the one of the insulating films.

8. The particle detection apparatus according to claim 7, further comprising a hardware processor configured to calculate a position of the particle incidence in the third direction, based on a position on the one of the insulating films where the tunneling current is generated.

9. The particle detection apparatus according to claim 5, wherein the second detection circuit is configured to detect a pulse voltage as the voltage generated in the plurality of conductive lines.

10. The particle detection apparatus according to claim 9, further comprising a hardware processor configured to
measure the pulse voltage with respect to the plurality of conductive lines, and
calculate, based on change of the measured pulse voltage, a position of particle incidence in the third direction.

11. The particle detection apparatus according to claim 10, w % herein the hardware processor is configured to
detect, for each of the plurality of conductive lines, a peak voltage indicating a maximum value among absolute values of voltages measured with respect to a corresponding one of the plurality of conductive line,
specify one of the plurality of conductive lines from which a positive peak voltage is detected and another one of the plurality of conductive lines from which a negative peak voltage is detected, and
execute the calculation of a position of particle incidence in the third direction, based on the specified two conductive lines.

12. A particle detection method implemented by a computer, the method comprising:
detecting a voltage change due to particle incidence into one of a plurality of superconductive lines each including a superconductive material, the plurality of superconductive lines extending in a first direction and being arranged in a second direction intersecting the first direction;
detecting, when the voltage change occurs, a current or a voltage generated in one of a plurality of conductive lines connected to the one of the plurality of superconductive lines through an insulating film, the plurality of conductive lines each including a conductive material, the plurality of conductive lines extending in a third direction different from the first direction and being arranged in a fourth direction intersecting the third direction;
calculating a position of the particle incidence in the first direction, based on the voltage change occurring in the one of the plurality of superconductive lines; and
calculating a position of the particle incidence in the third direction, based on the current or the voltage generated in the one of the plurality of conductive lines.

* * * * *

UNITED STATES PATENT AND TRADEMARK OFFICE
CERTIFICATE OF CORRECTION

PATENT NO. : 11,588,092 B2  
APPLICATION NO. : 17/463282  
DATED : February 21, 2023  
INVENTOR(S) : Takeshi Yamane Page 1 of 1

It is certified that error appears in the above-identified patent and that said Letters Patent is hereby corrected as shown below:

In the Claims

• Claim 5, Column 11, Line 47, "plurality of conductive lines," should read --plurality of conductive lines;--.

• Claim 11, Column 12, Line 23, "w % herein" should read --wherein--.

Signed and Sealed this  
Fifth Day of September, 2023

Katherine Kelly Vidal  
*Director of the United States Patent and Trademark Office*